United States Patent
Wang et al.

(10) Patent No.: US 8,178,945 B2
(45) Date of Patent: May 15, 2012

(54) PROGRAMMABLE PN ANTI-FUSE

(75) Inventors: Ping-Chuan Wang, Hopewell Junction, NY (US); Robert C. Wong, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/698,302

(22) Filed: Feb. 2, 2010

(65) Prior Publication Data

US 2010/0295132 A1 Nov. 25, 2010

Related U.S. Application Data

(60) Provisional application No. 61/149,527, filed on Feb. 3, 2009.

(51) Int. Cl.
*H01L 23/52* (2006.01)

(52) U.S. Cl. .......... 257/530; 257/50; 257/E23.146; 257/E23.147; 257/E21.592; 438/131; 438/467; 438/600

(58) Field of Classification Search .......... 257/50, 257/530, E23.146, E23.147, E21.592; 438/131, 438/467, 600
See application file for complete search history.

(56) References Cited

U.S. PATENT DOCUMENTS

| | | | |
|---|---|---|---|
| 7,075,127 B2 | 7/2006 | Kothandaraman et al. |
| 2005/0259495 A1 | 11/2005 | Chung |
| 2006/0065946 A1 | 3/2006 | Mehrad et al. |
| 2006/0181308 A1 | 8/2006 | Madurawe |
| 2007/0099326 A1 | 5/2007 | Hsu et al. |

*Primary Examiner* — Evan Pert
*Assistant Examiner* — Eduardo A Rodela
(74) *Attorney, Agent, or Firm* — Hoffman Warnick LLC; Joseph J. Petrokaitis

(57) ABSTRACT

Structure and method for providing a programmable anti-fuse in a FET structure. A method of forming the programmable anti-fuse includes: providing a p– substrate with an n+ gate stack; implanting an n+ source region and an n+ drain region in the p– substrate; forming a resist mask over the n+ drain region, while leaving the n+ source region exposed; etching the n+ source region to form a recess in the n+ source region; and growing a p+ epitaxial silicon germanium layer in the recess in the n+ source region to form a pn junction that acts as a programmable diode or anti-fuse.

20 Claims, 4 Drawing Sheets

PROGRAMMABLE PN ANTI-FUSE

This non-provisional application claims the benefit of the provisional application filed with the United States Patent and Trademark Office as Ser. No. 61/149,527 entitled "Programmable PN Anti-Fuse", filed Feb. 3, 2009.

BACKGROUND

1. Technical Field

The disclosure relates generally to electrically programmable fuses packaged in semiconductor devices, and more particularly relates to an electrically programmable anti-fuse implemented using a PN diode.

2. Background Art

In the integrated circuit (IC) fabrication industry, electrically programmable fuses ("eFuses") are being incorporated in IC chips to provide, e.g., memory redundancy, passive component (e.g., resistors and capacitors) trimming, and post packaging product customization. However, current eFuse devices utilize silicide electromigration, which requires a very high energy to blow the fuse. This required level of energy results in a thermal and mechanical impact to the chip, which can damage surrounding devices. Current eFuses also require a large drive transistor (e.g., 6-10 um wide) to supply sufficient current for programming.

SUMMARY

Disclosed is a structure and method for forming a programmable anti-fuse in a field effect transistor (FET) structure. The initial state of the anti-fuse is "open." After programming, the anti-fuse is "shorted."

A first aspect of the disclosure provides a method of forming a programmable anti-fuse in a field effect transistor (FET device), comprising: providing a substrate with a gate stack; implanting a source region and a drain region in the substrate; forming a resist mask over the drain region, while leaving the source region exposed; etching the source region to form a recess in the source region; and growing an epitaxial silicon germanium layer in the recess in the source region to form a pn junction.

A second aspect of the disclosure provides a field effect transistor (FET) structure having a programmable anti-fuse, comprising: a substrate of a first type implanted with drain and source regions of a second type; an epitaxial silicon germanium layer positioned above the source region to form a pn junction; a conductive layer placed within each of the drain region, a gate region, and the epitaxial silicon germanium layer; and wherein the pn junction forms a diode that acts as a programmable anti-fuse that initially prevents current from flowing through the epitaxial silicon germanium layer between the source region and the conductive layer over the epitaxial silicon germanium layer.

A third aspect of the disclosure provides a method for programming an anti-fuse on an integrated circuit device, comprising: (a) providing a field effect transistor (FET) structure having: a substrate of a first type implanted with drain and source regions of a second type; an epitaxial silicon germanium layer positioned above the source region to form a pn junction; a conductive layer placed within each of the drain region, a gate region, and the epitaxial silicon germanium layer; and wherein the pn junction forms a diode that acts as a programmable anti-fuse that initially prevents current from flowing through the epitaxial silicon germanium layer between the source region and the conductive layer over the epitaxial silicon germanium layer; (b) applying a voltage Vdd to the conductive layer above the drain region; and (c) turning on the FET by applying a voltage Vg to the conductive layer above the gate region.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

Figure 1:
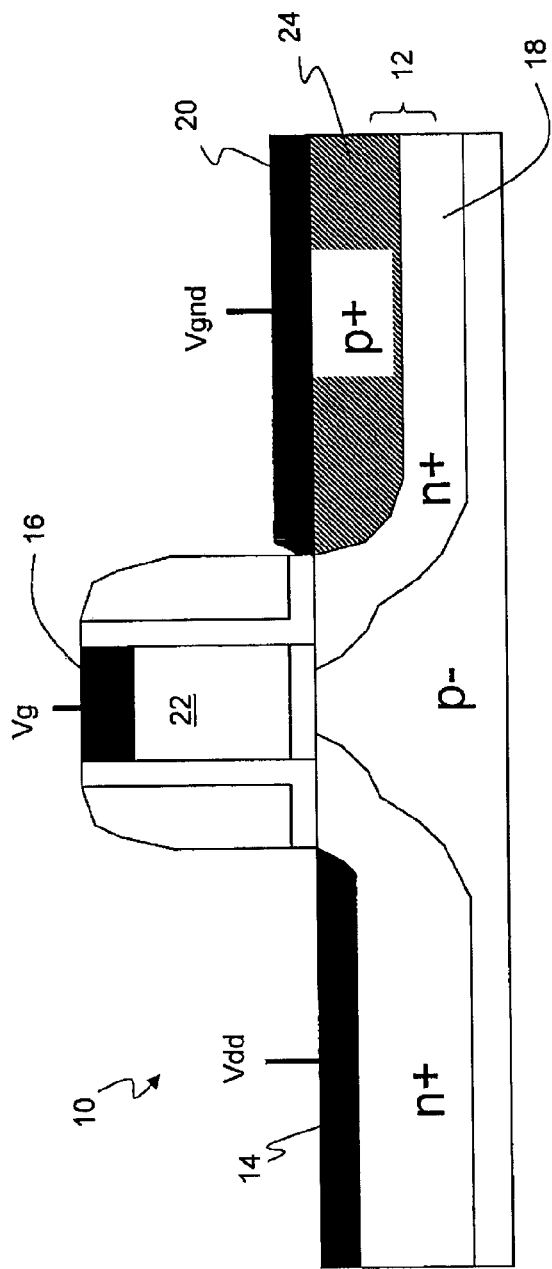
FIG. 1 shows a field effect transistor (FET) structure having an PN diode fabricated within, in accordance with an embodiment of the present invention.

Referring to the drawings, FIG. 1 depicts an NFET structure 10 having a pn junction 12 that forms a programmable diode or anti-fuse. NFET structure 10 generally includes a drain 14 coupled to power source Vdd, a gate 16 formed above a channel region 22 coupled to a gate voltage source Vg, a source 18, and a p+ region 24 formed between source 18 and a conductive region 20. Source 18 and conductive region 20 comprise the input and output of the diode formed by pn junction 12. As described in detail below, p+ region 24 is formed from an epitaxial silicon germanium, which is initially reverse biased to prevent current from flowing through. However, p+ region 24 can be altered using Vdd and Vg to create a short and allow current to flow.

Figure 2:
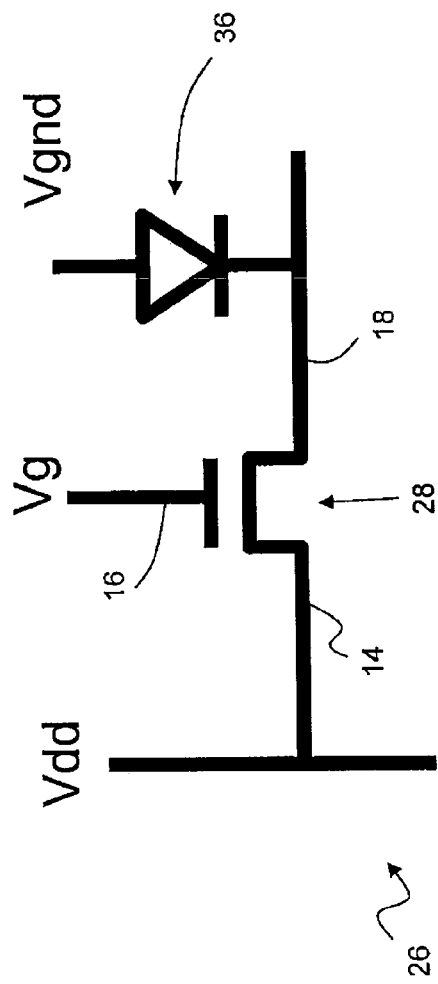
FIG. 2 depicts a corresponding circuit diagram for the structure of FIG. 1 in accordance with an embodiment of the present invention.

FIG. 2 depicts an electrical schematic 26 of the NFET structure 10 shown in FIG. 1. As can be seen, NFET 28 has a drain 14 connected to Vdd, a gate 16 connected to Vg, and a source 18 connected to a first node of diode 36. A second node of diode 36 is connected to ground voltage Vgnd. As constructed, diode 36 initially prevents current from passing between source 18 and ground (Vgnd). In a programming mode, diode 36 can be placed in a permanent "short" mode, after which current can pass between source 18 and Vgnd (i.e., a blown anti-fuse). In order to "blow the anti-fuse" in the programming mode, a voltage Vdd is applied to drain 14 and gate 16 is turned on with a voltage Vg. This results in a current flow out the source 18 and into the p+ region 24 (FIG. 1), causing the pn junction 12 to become disable. A permanent low resistance between source 18 and Vgnd results, allowing current to flow.

Figure 3:
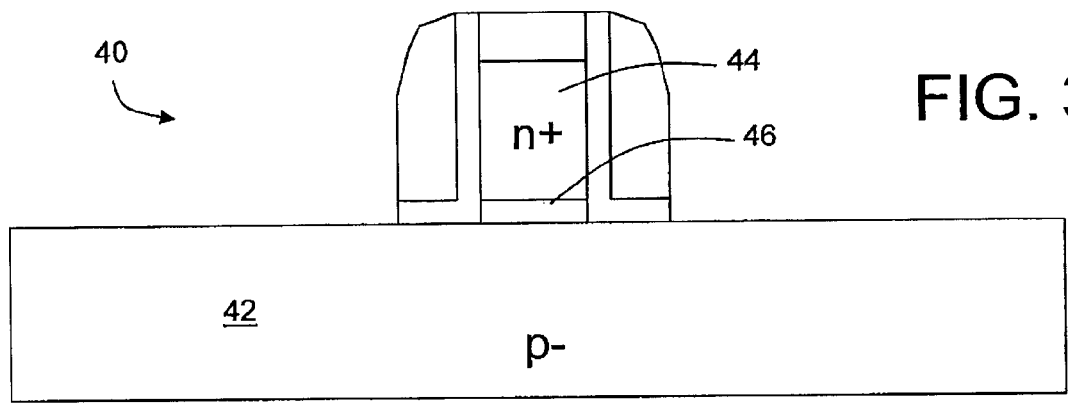
FIGS. 3-9 show the fabrication steps for forming the structure of FIG. 1 in accordance with an embodiment of the present invention.
Figure 4:
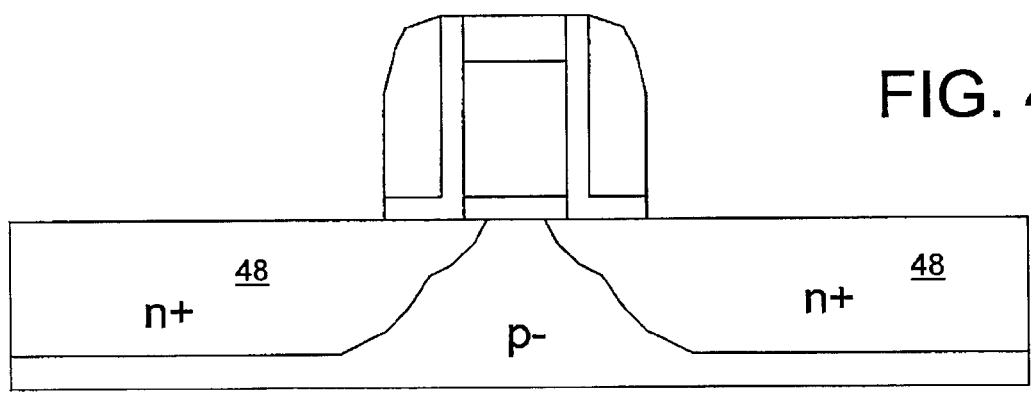
Figure 5:
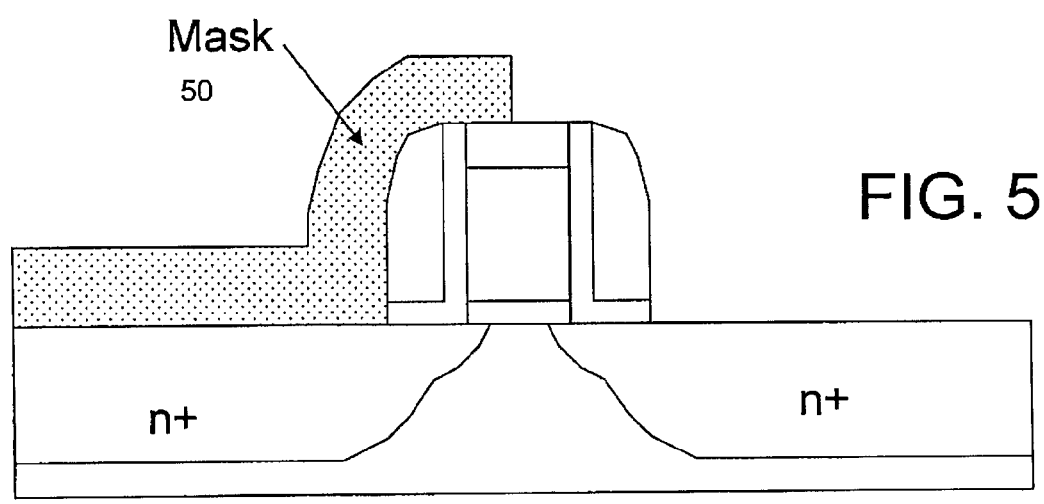
Figure 6:
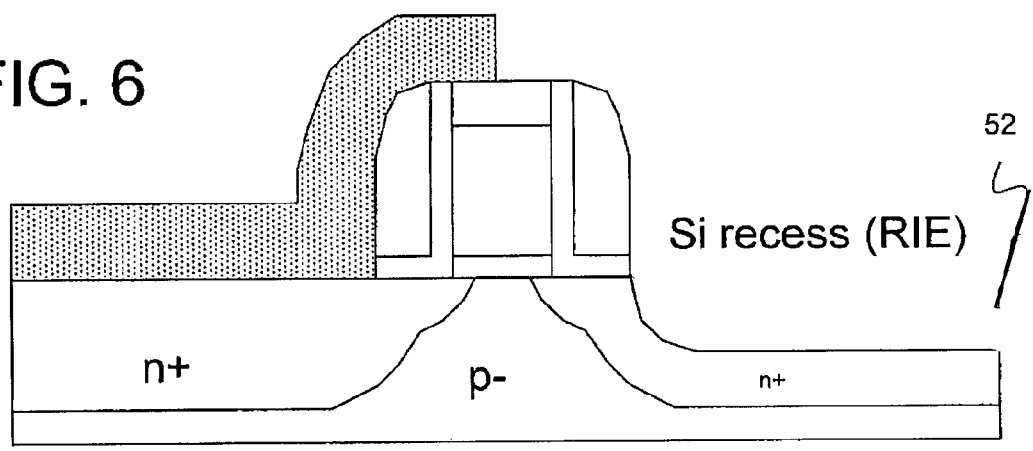
Figure 7:
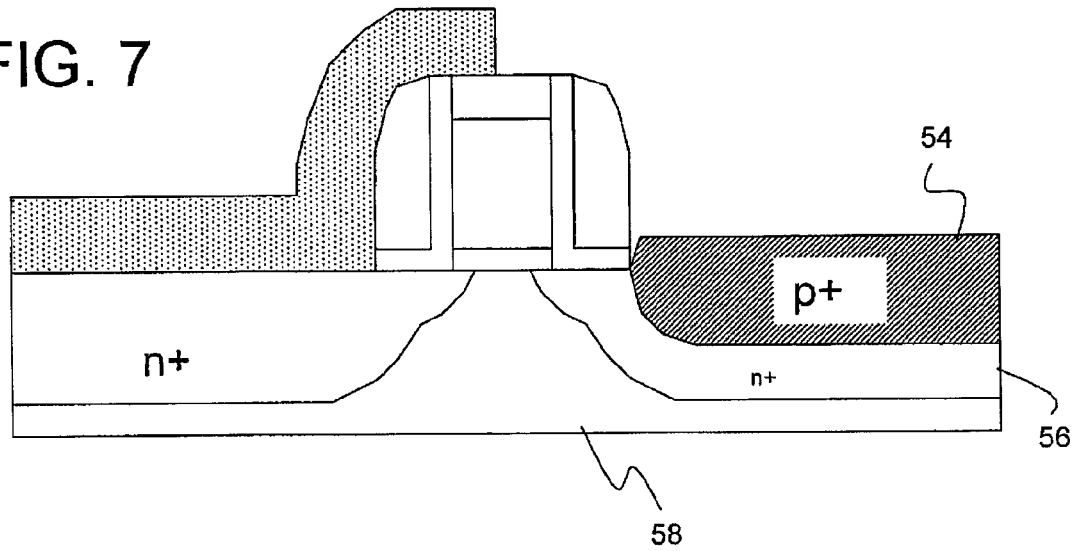
Figure 8:
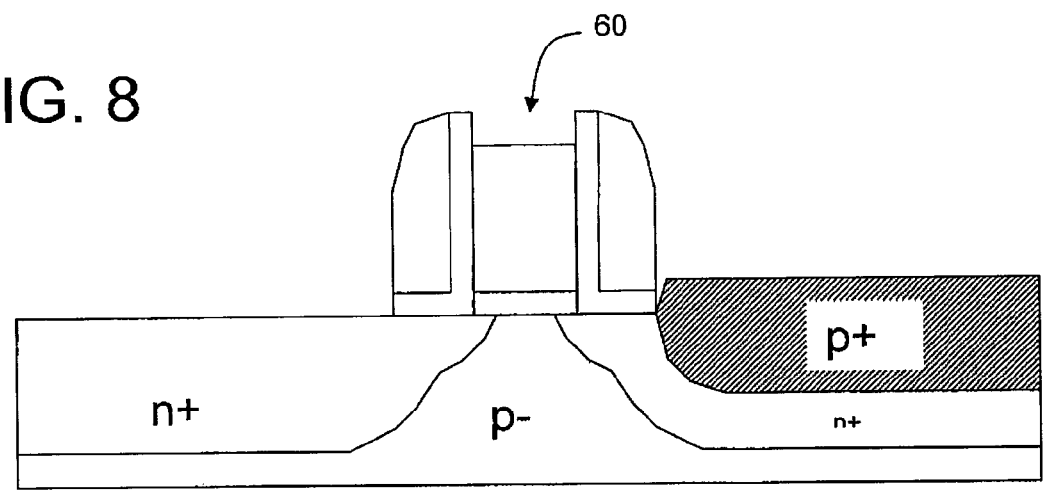
Figure 9:
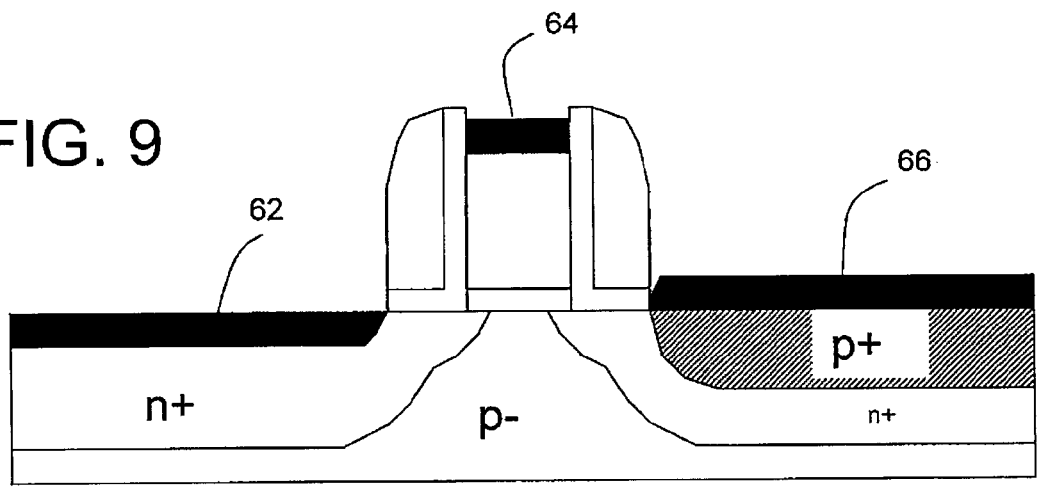

FIGS. 3-9 depict an illustrative embodiment for forming the NFET structure 10 of FIG. 1. FIG. 3 depicts a standard FET gate stack process 40 in which an n+ region 44 (gate stack region) is formed above a p− region 42 (substrate), in which a gate dielectric 46 separates the two regions 42, 44. In FIG. 4, n+ junctions 48 for the source region and drain region are formed, e.g., with an implant process. In FIG. 5, a resist mask 50 is placed over half of the structure containing the drain region. In FIG. 6, a recessed region 52 is etched from the source region. In FIG. 7, epitaxial silicon germanium Epi-SiGe is grown in the recessed region 52 over the n+ source region on the structure. An Epi-SiGe growth (in-situ p+ doped) region 54 is thus formed, which creates a PNP structure including p+ region 54, doped n+ region 56, and p– region 58. The pn junction between the p+ region 54 and doped n+ region 56 forms a closed path that initially prevents current from flowing. As noted above, the anti-fuse can thereafter be enabled by applying Vdd to the drain and Vg to the gate. In FIG. 8, the cap 60 is removed from the gate region, and a salicidation process is utilized to form conductive regions 62, 64, 66 in FIG. 9.

In an illustrative embodiment for a 45 nm device, the Epi-SiGe dopant may be between $e^{-19}$ and $e^{-20}$ cm$^{-3}$. Doping levels for the p–, n+, and p+ regions may for instance be approximately $e^{-17}$, $e^{-20}$, and $e^{-20}$ cm$^{-3}$. A 4.25 volt application to Vdd in the programming mode will create a reverse bias in the diode that will result in an approximate 500 ohm resistance on a 3 mA compliant device. A 5 volt application to Vdd in the programming mode will create a reverse bias in the diode that will result in an approximate 600 ohm resistance on a 5 mA compliant device.

Note that while the illustrative embodiments described herein are implemented in an NFET device, the inventive feature of a programmable diode could likewise be implemented in a PFET structure. In such a case, the PFET device would be fabricated with n+ doped SiGe source region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a programmable anti-fuse in a field effect transistor (FET device), comprising:
   providing a substrate with a gate stack;
   implanting a source region and a drain region in the substrate;
   forming a resist mask over the drain region, while leaving the source region exposed;
   etching the source region to form a recess in the source region; and
   growing an epitaxial silicon germanium layer in the recess in the source region to form a pn junction.

2. The method of claim 1, where the substrate is a p– type region and the gate stack is a n+ type region.

3. The method of claim 2, wherein the source and drain regions are implanted as n+ type regions.

4. The method of claim 1, further comprising removing a cap from the gate stack and forming a silicide layer in the drain region, gate stack, and epitaxial silicon germanium layer.

5. The method of claim 1, wherein the epitaxial silicon germanium layer is a p+ type region.

6. The method of claim 1, wherein the pn junction forms an anti-fuse that prevents current from flowing through the epitaxial silicon germanium layer between the source region and the silicide layer over the epitaxial silicon germanium layer.

7. The method of claim 6, further comprising programming the anti-fuse by enabling the anti-fuse, wherein the anti-fuse is enabled by applying Vdd to the drain region and turning the FET on by applying a voltage Vg to the gate region.

8. A field effect transistor (FET) structure having a programmable anti-fuse, comprising:
   a substrate of a first type implanted with drain and source regions of a second type;
   an epitaxial silicon germanium layer positioned above the source region to form a pn junction;
   a conductive layer placed within each of the drain region, a gate region, and the epitaxial silicon germanium layer; and
   wherein the pn junction forms a diode that acts as a programmable anti-fuse that initially prevents current from flowing through the epitaxial silicon germanium layer between the source region and the conductive layer over the epitaxial silicon germanium layer.

9. The FET structure of claim 8, wherein the programmable anti-fuse can be enabled by applying a voltage Vdd to the drain region and turning on the FET by applying a voltage Vg to the gate region.

10. The FET structure of claim 8, wherein the substrate is a p− type region, the source and drain regions are n+ type regions, and the epitaxial silicon germanium layer is a p+ type region.

11. The FET structure of claim 8, wherein each conductive layer comprises silicide.

12. The FET structure of claim 8, wherein the FET structure is an NFET.

13. The FET structure of claim 8, wherein the FET structure is a PFET.

14. A method for programming an anti-fuse on an integrated circuit device, comprising:
  (a) providing a field effect transistor (FET) structure having:
    a substrate of a first type implanted with drain and source regions of a second type;
    an epitaxial silicon germanium layer positioned above the source region to form a pn junction;
    a conductive layer placed within each of the drain region, a gate region, and the epitaxial silicon germanium layer; and
    wherein the pn junction forms a diode that acts as a programmable anti-fuse that initially prevents current from flowing through the epitaxial silicon germanium layer between the source region and the conductive layer over the epitaxial silicon germanium layer;
  (b) applying a voltage Vdd to the conductive layer within the drain region; and
  (c) turning on the FET by applying a voltage Vg to the conductive layer within the gate region.

15. The method of claim 14, wherein the substrate is a p− type region, the source and drain regions are n+ type regions, and the epitaxial silicon germanium layer is a p+ type region.

16. The method of claim 14, wherein each conductive layer comprises silicide.

17. The method of claim 14, wherein the epitaxial silicon germanium layer is doped at a level between $e^{-19}$ and $e^{-20}$ $cm^{-3}$.

18. The method of claim 14, wherein Vdd is between 4 and 6 volts.

19. The method of claim 14, wherein the FET is an NFET.

20. The method of claim 14, wherein the FET is a PFET.

* * * * *